US010998020B1

(12) United States Patent
Tsai et al.

(10) Patent No.: US 10,998,020 B1
(45) Date of Patent: May 4, 2021

(54) MEMORY SYSTEM AND MEMORY ACCESS INTERFACE DEVICE THEREOF

(71) Applicant: REALTEK SEMICONDUCTOR CORPORATION, Hsinchu (TW)

(72) Inventors: Fu-Chin Tsai, Hsinchu (TW);
Chun-Chi Yu, Hsinchu (TW);
Chih-Wei Chang, Hsinchu (TW);
Gerchih Chou, San Jose, CA (US);
Kuo-Wei Chi, Hsinchu (TW);
Shih-Chang Chen, Hsinchu (TW);
Shih-Han Lin, Hsinchu (TW);
Min-Han Tsai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/866,886

(22) Filed: May 5, 2020

(51) Int. Cl.
  *G11C 8/00* (2006.01)
  *G11C 7/22* (2006.01)
  *G11C 7/10* (2006.01)
  *H03K 7/08* (2006.01)
  *G11C 8/18* (2006.01)

(52) U.S. Cl.
  CPC .......... *G11C 7/222* (2013.01); *G11C 7/1066* (2013.01); *G11C 7/1093* (2013.01); *G11C 8/18* (2013.01); *H03K 7/08* (2013.01)

(58) Field of Classification Search
  CPC ..... G11C 7/222; G11C 7/1066; G11C 7/1093; G11C 8/18; H03K 7/08
  USPC .......................................... 365/230.01–243.5
  See application file for complete search history.

(56) References Cited

U.S. PATENT DOCUMENTS

| 9,570,130 | B2 | 2/2017 | Yu et al. | |
| 2002/0039323 | A1* | 4/2002 | Tokutome | G11C 7/1066 365/233.12 |
| 2002/0064072 | A1* | 5/2002 | Ooishi | G11C 7/1072 365/189.05 |
| 2003/0002316 | A1* | 1/2003 | Morita | G11C 7/22 365/63 |

(Continued)

OTHER PUBLICATIONS

"Memory Access Interface Device", U.S. Appl. No. 16/408,873, filed May 10, 2019.

(Continued)

*Primary Examiner* — Harry W Byrne
(74) *Attorney, Agent, or Firm* — WPAT, PC (57) ABSTRACT

The present disclosure discloses a memory access interface device. The clock generation circuit thereof generates reference clocks. Each of the DDR access signal transmission circuits thereof, under a DDR mode, adjusts a phase and a duty cycle of one of DDR access signals according to one of DDR reference clock signals to generate one of output access signals to access the memory device. The data signal transmission circuit thereof, under an SDR mode, applies a minimum latency on an SDR data signal according to the command and address reference clock signal to generate an output SDR data signal to access the memory device. The command and address signal transmission circuit thereof, under either the DDR or SDR mode, applies a programmable latency on a command and address signal according to the command and address reference clock signal to generate an output command and address signal to access the memory device.

18 Claims, 3 Drawing Sheets

(56) References Cited

U.S. PATENT DOCUMENTS

2003/0103407 A1* 6/2003 Ooishi ................ G11C 7/1045
　　　　　　　　　　　　　　　　　　365/233.12

OTHER PUBLICATIONS

"DDR SDRAM physical layer interface circuit and DDR SDRAM control device", U.S. Appl. No. 16/182,680, filed Nov. 7, 2018.

* cited by examiner

MEMORY SYSTEM AND MEMORY ACCESS INTERFACE DEVICE THEREOF

BACKGROUND OF THE INVENTION

1. Field of the Invention

The present disclosure relates to a memory system and a memory access interface device thereof.

2. Description of Related Art

Memory devices in earlier design may include a single data rate (SDR) configuration having a low speed. However, due to the increasing requirement of the bandwidth of the products, the conventional configuration of single data rate cannot fulfill the requirement of the speed. As a result, a double data rate (DDR) configuration is proposed to accomplish a higher speed.

However, the memory controllers on the market are requested to support all the memory devices having different speeds and the ability of signal calibration. Accordingly, what is needed is a memory system and a memory access interface device thereof to address the above issues.

SUMMARY OF THE INVENTION

In consideration of the problem of the prior art, an object of the present disclosure is to provide a memory system and a memory access interface device thereof.

The present disclosure discloses a memory access interface device that includes a clock generation circuit, a pair of DDR access signal transmission circuits, a data signal transmission circuit and a command and address signal transmission circuit. The clock generation circuit is configured for generating an operation clock signal directly to a memory device, a pair of double data rate (DDR) reference clock signals and a command and address reference clock signal according to a source clock signal. Each of the pair of DDR access signal transmission circuits is configured for, under a DDR mode, adjusting a phase and a duty cycle of one of a pair of DDR access signals from a memory access controller according to one of the pair of DDR reference clock signals to generate one of a pair of output access signals to access the memory device, wherein the pair of DDR access signals include a DDR data signal and a data strobe signal and the pair of the output access signals include an output DDR data signal and an output data strobe signal. The data signal transmission circuit is configured for, under a single data rate (SDR) mode, applying a minimum latency on an SDR data signal from the memory access controller according to the command and address reference clock signal to generate an output SDR data signal to access the memory device. The command and address signal transmission circuit is configured for, under either the DDR mode or the SDR mode, applying a programmable latency on a command signal and an address signal from the memory access controller according to the command and address reference clock signal to generate an output command signal and an output address signal to access the memory device.

The present disclosure also discloses a memory system that includes a memory access controller, a memory device and a memory access interface device. The memory access interface device includes a clock generation circuit, a pair of DDR access signal transmission circuits, a data signal transmission circuit and a command and address signal transmission circuit. The clock generation circuit is configured for generating an operation clock signal directly to the memory device, a pair of DDR reference clock signals and a command and address reference clock signal according to a source clock signal. Each of the pair of DDR access signal transmission circuits is configured for, under a DDR mode, adjusting a phase and a duty cycle of one of a pair of DDR access signals from the memory access controller according to one of the pair of DDR reference clock signals to generate one of a pair of output access signals to access the memory device, wherein the pair of DDR access signals include a DDR data signal and a data strobe signal and the pair of the output access signals include an output DDR data signal and an output data strobe signal. The data signal transmission circuit is configured for, under an SDR mode, applying a minimum latency on an SDR data signal from the memory access controller according to the command and address reference clock signal to generate an output SDR data signal to access the memory device. The command and address signal transmission circuit is configured for, under either the DDR mode or the SDR mode, applying a programmable latency on a command signal and an address signal from the memory access controller according to the command and address reference clock signal to generate an output command signal and an output address signal to access the memory device.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a memory system and a memory access interface device thereof.

Figure 1:
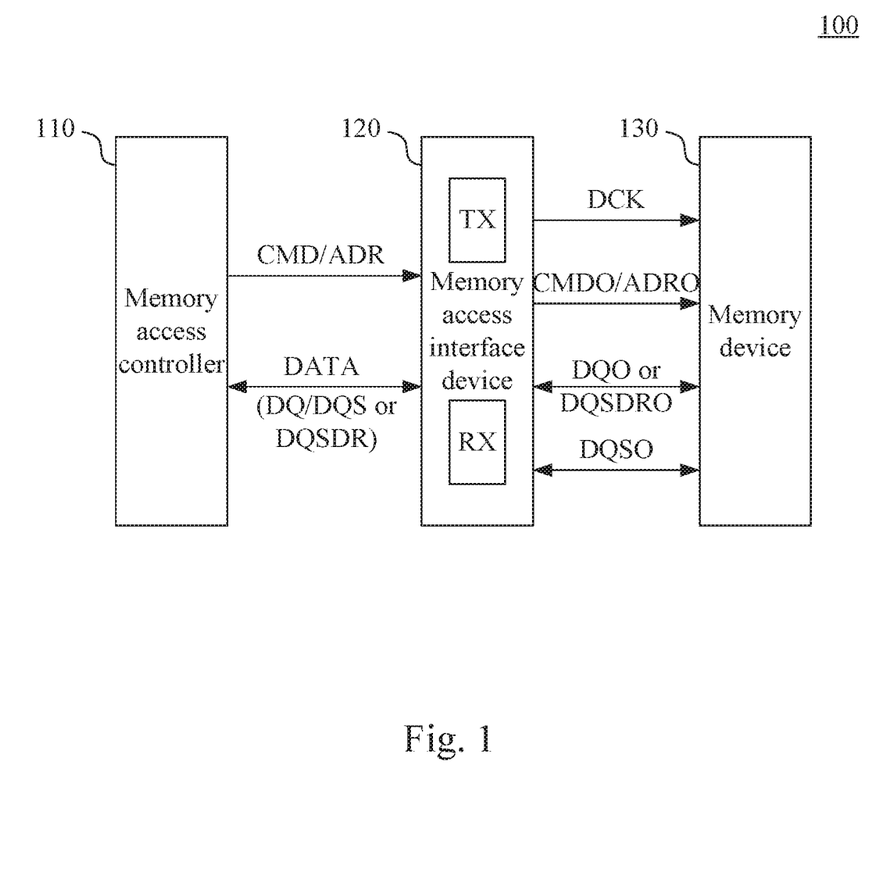
FIG. 1 illustrates a block diagram of a memory system according to an embodiment of the present invention.

Reference is now made to FIG. 1. FIG. 1 illustrates a block diagram of a memory system 100 according to an embodiment of the present invention. The memory system 100 includes a memory access controller 110, a memory access interface device 120 and a memory device 130.

The memory system 100 can be electrically coupled to other modules through such as, but not limited to a system bus (not illustrated). For example, the memory system 100 can be electrically coupled to a processor (not illustrated) through a system bus such that the processor can access the memory system 100.

In an embodiment, the memory access interface device 120 can be such as, but not limited to a physical layer circuit. The memory device 130 can be either a single data rate (SDR) memory device or a double data rate (DDR) memory device.

External access signals, e.g. the access signals from the processor, can be received by the memory access controller 110 first and can be transmitted to the memory access interface device 120. Further, the access signals can be transmitted from the memory access interface device 120 to the memory device 130 to access the memory device 130.

More specifically, in an embodiment, the memory access controller 110 can receive and transmit the access signals including such as, but not limited to a command signal CMD, an address signal ADR and a data signal DATA to the memory access interface device 120. The transmission of the command signal CMD and the address signal ADR can be performed by using one signal path and the transmission of the data signal DATA can be performed by using another signal path.

The memory access interface device 120 applies latency on the command signal CMD and the address signal ADR to adjust the timing thereof to generate an output command signal CMDO and an output address signal ADRO to the memory device 130.

Under the condition that the memory device 130 is the SDR memory device, the data signal DATA includes only one SDR access signal, which is an SDR data signal DQSDR. The memory access interface device 120 thus operates under an SDR mode to apply latency on the SDR data signal DQSDR to generate an output SDR data signal DQSDRO to the memory device 130.

Under the condition that the memory device 130 is the DDR memory device, the data signal DATA includes a pair of DDR access signals, which includes a DDR data signal DQ and a data strobe signal DQS, such that the memory access interface device 120 operates under a DDR mode to adjust the phase of the DDR data signal DQ and the data strobe signal DQS to generate an output DDR data signal DQO and an output data strobe signal DQSO to the memory device 130.

The transmission of the output command signal CMDO and the output address signal ADRO can be performed by using one signal path. The transmission of the output DDR data signal DQO or the output SDR data signal DQSDRO can be performed by using another signal path. The transmission of the output data strobe signal DQSO can be performed by using yet another signal path.

Moreover, the memory access interface device 120 is further configured for generating an operation clock signal DCK through still another signal path to the memory device 130 such that the memory device 130 operates accordingly.

The internal data of the memory device 130 can thus be accessed according to the correct timing of the signals transmitted to the memory device 130 described above.

The memory access interface device 120 substantially includes a receiver RX and a transmitter TX. The configuration and the operation of the transmitter TX are described in detail in the following paragraphs.

Figure 2:
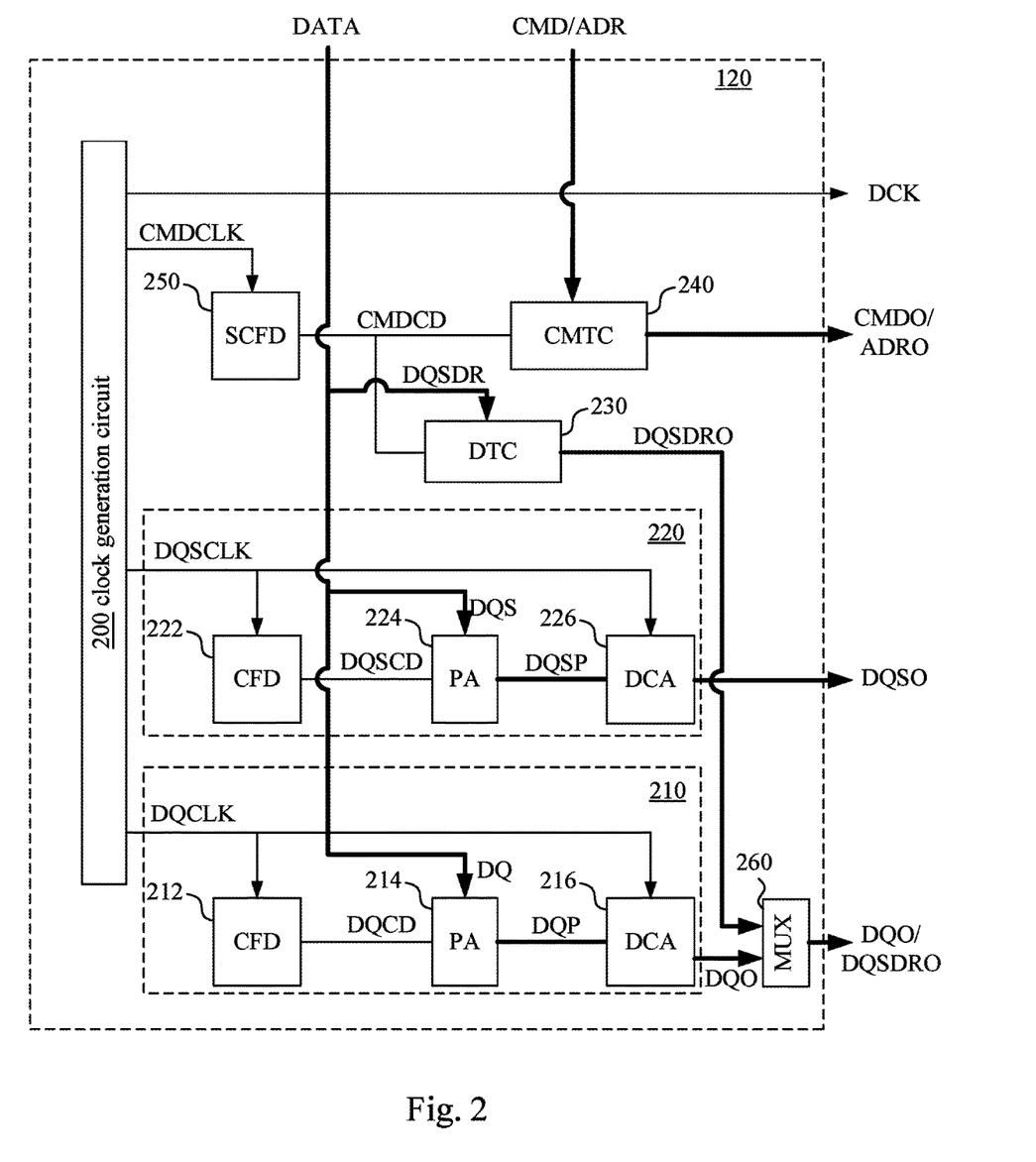
FIG. 2 illustrates a detailed block diagram of the memory access interface device in FIG. 1 according to an embodiment of the present invention.

Reference is now made to FIG. 2. FIG. 2 illustrates a detailed block diagram of the memory access interface device 120 in FIG. 1 according to an embodiment of the present invention. It is appreciated that only the transmitter TX of the memory access interface device 120 is illustrated in FIG. 2 without illustrating the receiver RX.

The memory access interface device 120 includes a clock generation circuit 200, a pair of DDR access signal transmission circuits 210 and 220, a data signal transmission circuit 230 (abbreviated as DTC in FIG. 2) and a command and address signal transmission circuit 240 (abbreviated as CMTC in FIG. 2).

The clock generation circuit 200 is configured for generating the operation clock signal DCK directly to the memory device 130, a pair of double data rate (DDR) reference clock signals and a command and address reference clock signal CMDCLK according to a source clock signal.

In an embodiment, the pair of DDR reference clock signals include a data reference clock signal DQCLK and a data strobe reference clock signal DQSCLK.

Under a DDR mode, the DDR access signal transmission circuits 210 and 220 respectively corresponds to the processing of the DDR data signal DQ and the data strobe signal DQS.

The DDR access signal transmission circuit 210 includes a clock frequency division circuit 212 (abbreviated as CFD in FIG. 2), a phase adjusting circuit 214 (abbreviated as PA in FIG. 2) and a duty cycle adjusting circuit 216 (abbreviated as DCA in FIG. 2).

The clock frequency division circuit 212 is configured for dividing a frequency of the data reference clock signal DQCLK to generate a divided DDR reference clock, which is a divided data reference clock signal DQCD.

The phase adjusting circuit 214 is configured for receiving the DDR data signal DQ from the memory access controller 110 to adjust the phase of the DDR data signal DQ according to the divided data reference clock signal DQCD to generate a phase-adjusted access signal DQP.

In an embodiment, the phase adjusting circuit 214 may include at least one flip-flop to sample the DDR data signal DQ according to the phase of the divided data reference clock signal DQCD to accomplish the phase-adjusting mechanism.

In an embodiment, when a rising edge of the divided data reference clock signal DQCD is within a set-up and hold time of a waveform of the data signal DQ, a timing violation issue is easy to occur since the set-up and hold time is the transition time of the waveform of the DDR data signal DQ turning from a low state to a high state.

As a result, in an embodiment, the phase adjusting circuit 214 can adjust the phase of the DDR data signal DQ according to a sample result of the rising edge and a falling edge of the divided data reference clock signal DQCD. In an embodiment, when the signal transmission is not sampled by the rising edge of the divided data reference clock signal DQCD and the signal transmission is sampled by the falling edge of the divided data reference clock signal DQCD, the phase adjusting circuit 214 can adjust the phase of the DDR data signal DQ according to such as, but not limited to the falling edge of the divided data reference clock signal DQCD.

It is appreciated that the configuration of the phase adjusting circuit 214 described above is merely an example. In other embodiments, the configuration of the phase adjusting circuit 214 can be different.

The duty cycle adjusting circuit 216 is configured for adjusting a duty cycle of the phase-adjusted access signal DQP according to the data reference clock signal DQCLK to generate and transmit an output access signal, which is an output DDR data signal DQO, to the memory device 130.

In order to support the DDR mode that samples the data according to the rising edge and the falling edge at the same time, the duty cycle adjusting circuit 216 can operate according to the divided data reference clock signal DQCD divided from the data reference clock signal DQCLK such that the data reference clock signal DQCLK having a higher speed is used to fine tune the duty cycle of the phase-adjusted access signal DQP to become 50-50, which is the half of a time period. The adjusted result is outputted as the output DDR data signal DQO. It is appreciated that in practical implementation, the duty cycle may be deviated from the exact half of a time period by a reasonable difference due to the error caused by the components.

In an embodiment, the DDR access signal transmission circuit 220 may include a configuration identical to the DDR access signal transmission circuit 210, in which the DDR access signal transmission circuit 220 includes a clock frequency division circuit 222, a phase adjusting circuit 224 and a duty cycle adjusting circuit 226.

The clock frequency division circuit 222 is configured for dividing a frequency of the data strobe reference clock signal DQSCLK to generate a divided DDR reference clock, which is a divided data strobe reference clock signal DQSCD. The phase adjusting circuit 224 is configured for receiving the data strobe signal DQS from the memory access controller 110 to adjust the phase of the data strobe signal DQS according to the divided data strobe reference clock signal DQSCD to generate a phase-adjusted access signal DQSP. Further, the duty cycle adjusting circuit 226 is configured for adjusting a duty cycle of the phase-adjusted access signal DQSP according to the data strobe reference clock signal DQSCLK to generate and transmit an output access signal, which is an output data strobe signal DQSO, to the memory device 130.

In an embodiment, the memory access interface device 120 further includes a shared clock frequency division circuit 250 (abbreviated as SCFD in FIG. 2) configured for dividing the command and address reference clock signal CMDCLK to generate a divided command and address reference clock signal CMDCD such that the data signal transmission circuit 230 and the command and address signal transmission circuit 240 substantially receive the divided command and address reference clock signal CMDCD and operate accordingly.

Under an SDR mode, the data signal transmission circuit 230 only needs to process an SDR data signal DQSDR. As a result, no phase adjusting or duty guarantee is required to be performed. The data signal transmission circuit 230 is configured for applying a minimum latency on the SDR data signal DQSDR from the memory access controller 110 according to the divided command and address reference clock signal CMDCD to generate an output SDR data signal DQSDRO to access the memory device 130. In an embodiment, the minimum latency is much smaller than the processing time of the pair of DDR access signal transmission circuits 210 and 220.

Under either the DDR mode or the SDR mode, the command and address signal transmission circuit 240 is configured for applying a programmable latency on a command signal CMD and an address signal ADR from the memory access controller 110 according to the divided command and address reference clock signal CMDCD to generate an output command signal CMDO and an output address signal ADRO to the memory device 130.

Based on the above description, the memory access interface device 120 is able to access the memory device 130 whether the memory device 130 is a DDR memory device or an SDR memory device.

When the memory device 130 is the DDR memory device, the memory access interface device 120 operates in the DDR mode. The pair of DDR access signal transmission circuits 210 and 220 process the DDR data signal DQ and the data strobe signal DQS to generate the output DDR data signal DQO and the output data strobe signal DQSO.

The command and address signal transmission circuit 240 applies the programmable latency matching the processing time of the pair of DDR access signal transmission circuits 210 and 220 on the command signal CMD and the address signal ADR. The memory device 130 can be accessed according to the command signal CMD and the address signal ADR to write the data related to the output DDR data signal DQO and the output data strobe signal DQSO to the memory device 130.

When the memory device 130 is the SDR memory device, the memory access interface device 120 operates in the SDR mode. The data signal transmission circuit 230 applies a minimum latency on the SDR data signal DQSDR to generate the output SDR data signal DQSDRO.

The command and address signal transmission circuit 240 applies the programmable latency matching the minimum latency of the data signal transmission circuit 230 on the command signal CMD and the address signal ADR. The memory device 130 can be accessed according to the command signal CMD and the address signal ADR to write the data related to the output SDR data signal DQSDRO to the memory device 130.

In an embodiment, the memory access interface device 120 further includes a multiplexer circuit 260 (abbreviated as MUX in FIG. 2) configured for selecting the output DDR data signal DQO to be transmitted to the memory device 130 under the DDR mode and for selecting the output SDR data signal DQSDRO to be transmitted to the memory device 130 under the SDR mode.

Figure 3:
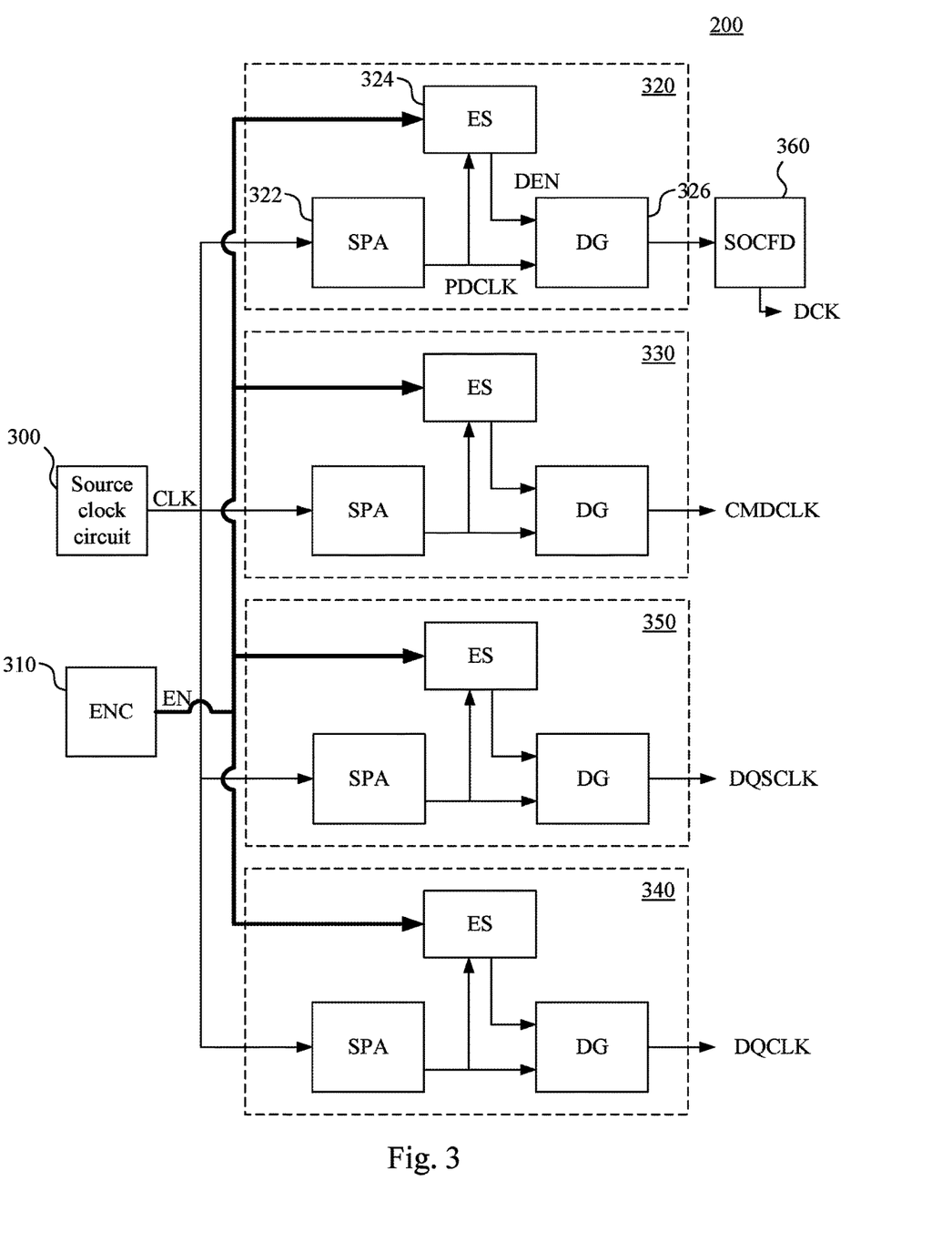
FIG. 3 illustrates a detailed block diagram of the clock generation circuit in FIG. 2 according to an embodiment of the present invention.

Reference is now made to FIG. 3. FIG. 3 illustrates a detailed block diagram of the clock generation circuit 200 in FIG. 2 according to an embodiment of the present invention.

The clock generation circuit 200 includes a source clock circuit 300, an enable signal generation circuit 310 (abbreviated as ENC in FIG. 3) and a plurality of clock phase adjusting circuits 320, 330, 340 and 350.

In an embodiment, the source clock circuit 300 can be such as, but not limited to an oscillator and is configured to generate a source clock signal CLK. The enable signal generation circuit 310 is configured to generate an enable signal EN.

In an embodiment, the clock phase adjusting circuits 320~350 include an operation clock phase adjusting circuit 320, a command and address clock phase adjusting circuit 330, a data clock phase adjusting circuit 340 and a data strobe clock phase adjusting circuit 350.

Take the operation clock phase adjusting circuit 320 as an example, the operation clock phase adjusting circuit 320 includes a source phase adjusting circuit 322 (abbreviated as SPA in FIG. 3), an enable synchronization circuit 324 (abbreviated as ES in FIG. 3) and a de-glitch circuit 326 (abbreviated as DG in FIG. 3).

The source phase adjusting circuit 322 is configured for receiving the source clock signal CLK to adjust the phase of the source clock signal CLK to generate a phase-adjusted clock signal, e.g. the phase-adjusted operation clock signal PDCLK. In an embodiment, the phase-adjusted operation clock signal PDCLK is delayed from the source clock signal CLK by 90 degrees.

The enable synchronization circuit 324 is configured for receiving the phase-adjusted operation clock signal PDCLK and the enable signal EN to adjust the enable signal EN according to the phase-adjusted operation clock signal PDCLK to generate a phase-adjusted enable signal, e.g. the phase-adjusted operation enable signal DEN, having a phase the same with the phase-adjusted operation clock signal PDCLK.

The de-glitch circuit 326 is configured for receiving the phase-adjusted operation enable signal DEN and the phase-adjusted operation clock signal PDCLK to be enabled by the phase-adjusted operation enable signal DEN to output the phase-adjusted clock signal PDCLK.

In an embodiment, the command and address clock phase adjusting circuit 330, the data clock phase adjusting circuit 340 and the data strobe clock phase adjusting circuit 350 include components identical to those of the operation clock phase adjusting circuit 320.

In an embodiment, the clock generation circuit 200 further includes a source clock frequency division circuit 360 (abbreviated as SOCFD in FIG. 3) configured for dividing a frequency of the phase-adjusted clock signal PDCLK from the operation clock phase adjusting circuit 320 to generate the operation clock signal DCK.

For the command and address clock phase adjusting circuit 330, the data clock phase adjusting circuit 340 and the data strobe clock phase adjusting circuit 350, the phase-adjusted clock signals generated therefrom are respectively correspond to the command and address reference clock signal CMDCLK, the data reference clock signal DQCLK and the data strobe reference clock signal DQSCLK. Since these circuits are able to generate the respective clock signals through the process identical to the operation clock phase adjusting circuit 320, the detail thereof is not described herein.

By using the configuration in FIG. 3, the clock generation circuit 200 can generate the reference clock signals that the DDR access signal transmission circuits 210 and 220, the data signal transmission circuit 230 and the command and address signal transmission circuit 240 require and each of the reference clock signals has an adjustable phase. As a result, the memory access interface device 120 can provide a precise signal calibration mechanism.

In an embodiment, the signal calibration can be performed in accompany with the memory access controller 110 such that the memory access controller 110 delivers the access signals to access content in the memory device 130 through the memory access interface device 120 and compares the accessed result with the content provided actively by the memory device 130. The comparison result is used to control the phase adjusting mechanism of the clock generation circuit 200 to accomplish the signal calibration mechanism.

It is appreciated that the de-glitch circuit of each of the clock phase adjusting circuits 320~350, e.g. the de-glitch circuit 326 in the clock phase adjusting circuits 320, is enabled by the phase-adjusted operation enable signal DEN at any one of a waveform of the phase-adjusted operation clock signal PDCLK having an even number count. The condition that the signal outputted from the de-glitch circuit 326 becomes the inverse of the phase-adjusted operation clock signal PDCLK generated by the source phase adjusting circuit 322 can be avoided.

As a result, the memory access interface device 120 is able to provide reference clock signals that are independent from each other under the DDR mode, each having an adjustable phase and within a large range of frequencies. The duty cycle of the output access signal can be guaranteed to be half of a time period. Further, the phase of the access signals can be adjusted accurately to access the memory device 120.

Moreover, the memory access interface device 120 is also able to provide reference clock signals under the SDR mode having the lower speed to keep the processing of the data signal, the command signal and the address signal to have a minimum latency.

It is appreciated that the embodiments described above are merely an example. In other embodiments, it should be appreciated that many modifications and changes may be made by those of ordinary skill in the art without departing, from the spirit of the invention.

In summary, the memory system and the memory access interface device thereof of the present invention can provide the reference signals under either SDR mode or DDR mode to adjusting the timing of the access signals to access the memory device with adjustable and accurate timing with a low cost.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory access interface device comprising:
    a clock generation circuit configured for generating an operation clock signal directly to a memory device, a pair of double data rate (DDR) reference clock signals and a command and address reference clock signal according to a source clock signal;
    a pair of DDR access signal transmission circuits each configured for, under a DDR mode, adjusting a phase and a duty cycle of one of a pair of DDR access signals from a memory access controller according to one of the pair of DDR reference clock signals to generate one of a pair of output access signals to access the memory device, wherein the pair of DDR access signals comprise a DDR data signal and a data strobe signal, and the pair of the output access signals comprise an output DDR data signal and an output data strobe signal;
    a data signal transmission circuit configured for, under a single data rate (SDR) mode, applying a minimum latency on an SDR data signal from the memory access controller according to the command and address reference clock signal to generate an output SDR data signal to access the memory device; and
    a command and address signal transmission circuit configured for, under either the DDR mode or the SDR mode, applying a programmable latency on a command signal and an address signal from the memory access controller according to the command and address reference clock signal to generate an output command signal and output address signal to access the memory device.

2. The memory access interface device of claim 1, wherein each of the pair of DDR access signal transmission circuits comprises:
    a clock frequency division circuit configured for dividing a frequency of the corresponding one of the pair of DDR reference clock signals to generate a divided DDR reference clock signal;
    a phase adjusting circuit configured for receiving the corresponding one of the pair of DDR access signals from the memory access controller to adjust the phase of the corresponding one of the pair of DDR access signals according to the divided DDR reference clock signal to generate a phase-adjusted access signal; and
    a duty cycle adjusting circuit configured for adjusting a duty cycle of the phase-adjusted access signal according to the corresponding one of the pair of DDR reference clock signals to generate and transmit the corresponding one of the pair of output access signals to the memory device.

3. The memory access interface device of claim 1, further comprising:

a shared clock frequency division circuit configured for dividing the command and address reference clock signal to generate a divided command and address reference clock signal such that the data signal transmission circuit and the command and address signal transmission circuit receive the divided command and address reference clock signal and operate accordingly.

4. The memory access interface device of claim 3, wherein under the DDR mode, an amount of the programmable latency matches a processing time of the pair of DDR access signal transmission circuits, and under the SDR mode, the amount of the programmable latency matches the minimum latency of the data signal transmission circuit.

5. The memory access interface device of claim 1, further comprising a multiplexer circuit configured for selecting an output data signal to be transmitted to the memory device under the DDR mode and for selecting the output SDR data signal to be transmitted to the memory device under the SDR mode, wherein the output data signal is one of the DDR access signals.

6. The memory access interface device of claim 1, wherein the clock generation circuit comprises:
a source clock circuit configured to generate the source clock signal;
an enable signal generation circuit configured to generate an enable signal; and
a plurality of clock phase adjusting circuits each comprising:
a source phase adjusting circuit configured to receive the source clock signal to adjust the phase of the source clock signal to generate a phase-adjusted clock signal;
an enable synchronization circuit configured to receive the phase-adjusted clock signal and the enable signal to adjust the enable signal according to the phase-adjusted clock signal to generate a phase-adjusted enable signal having a phase the same with the phase-adjusted clock signal; and
a de-glitch circuit configured to receive the phase-adjusted enable signal and the phase-adjusted clock signal to be enabled by the phase-adjusted enable signal to output the phase-adjusted clock signal as one of the operation clock signal, the pair of double data rate (DDR) reference clock signals and the command and address reference clock signal.

7. The memory access interface device of claim 6, wherein the clock generation circuit further comprises a source clock frequency division circuit configured for dividing a frequency of the phase-adjusted clock signal from one of the clock phase adjusting circuits to generate the operation clock signal.

8. The memory access interface device of claim 7, wherein the de-glitch circuit is enabled by the phase-adjusted enable signal at any one of a waveform of the phase-adjusted clock signal having an even number count.

9. The memory access interface device of claim 1, wherein the memory device is a DDR memory device or an SDR memory device.

10. A memory system comprising:
a memory access controller;
a memory device; and
a memory access interface device comprising:
a clock generation circuit configured for generating an operation clock signal directly to the memory device, a pair of double data rate (DDR) reference clock signals and a command and address reference clock according to a source clock signal;
a pair of DDR access signal transmission circuits each configured for, under a DDR mode, adjusting a phase and a duty cycle of one of a pair of DDR access signals from the memory access controller according to one of the pair of DDR reference clock signals to generate one of a pair of output access signals to access the memory device, wherein the pair of DDR access signals comprise a DDR data signal and a data strobe signal, and the pair of the output access signals comprise an output DDR data signal and an output data strobe signal;
a data signal transmission circuit configured for, under a single data rate (SDR) mode, applying a minimum latency on an SDR data signal from the memory access controller according to the command and address reference clock signal to generate an output SDR data signal to access the memory device; and
a command and address signal transmission circuit configured for, under either the DDR mode or the SDR mode, applying a programmable latency on a command signal and an address signal from the memory access controller according to the command and address reference clock signal to generate an output command signal and an output address signal to access the memory device.

11. The memory system of claim 10, wherein each of the pair of DDR access signal transmission circuits comprises:
a clock frequency division circuit configured for dividing a frequency of the corresponding one of the pair of DDR reference clock signals to generate a divided DDR reference clock signal;
a phase adjusting circuit configured for receiving the corresponding one of the pair of DDR access signals from the memory access controller to adjust the phase of the corresponding one of the pair of DDR access signals according to the divided DDR reference clock signal to generate a phase-adjusted access signal; and
a duty cycle adjusting circuit configured for adjusting a duty cycle of the phase-adjusted access signal according to the corresponding one of the pair of DDR reference clock signals to generate and transmit the corresponding one of the pair of output access signals to the memory device.

12. The memory system of claim 10, wherein the memory access interface device further comprises:
a shared clock frequency division circuit configured for dividing the command and address reference clock signal to generate a divided command and address reference clock signal such that the data signal transmission circuit and the command and address signal transmission circuit receive the divided command and address reference clock signal and operate accordingly.

13. The memory system of claim 12, wherein under the DDR mode, an amount of the programmable latency matches a processing time of the pair of DDR access signal transmission circuits and under the SDR mode, the amount of the programmable latency matches the minimum latency of the data signal transmission circuit.

14. The memory system of claim 10, wherein the memory access interface device further comprises a multiplexer circuit configured for selecting an output data signal to be transmitted to the memory device under the DDR mode and for selecting the output SDR data signal to be transmitted to the memory device under the SDR mode, wherein the output data signal is one of the DDR access signals.

15. The memory system of claim 10, wherein the clock generation circuit comprises:

a source clock circuit configured to generate the source clock signal;

an enable signal generation circuit configured to generate an enable signal; and a plurality of clock phase adjusting circuits each comprising:

a source phase adjusting circuit configured to receive the source clock signal to adjust the phase of the source clock signal to generate a phase-adjusted clock signal;

an enable synchronization circuit configured to receive the phase-adjusted clock signal and the enable signal to adjust the enable signal according to the phase-adjusted clock signal to generate a phase-adjusted enable signal having a phase the same with the phase-adjusted clock signal; and     a de-glitch circuit configured to receive the phase-adjusted enable signal and the phase-adjusted clock signal to be enabled by the phase-adjusted enable signal to output the phase-adjusted clock signal as one of the operation clock signal, the pair of double data rate (DDR) reference clock signals and the command and address reference clock signal.

16. The memory system of claim 15, wherein the clock generation circuit further comprises a source clock frequency division circuit configured for dividing a frequency of the phase-adjusted clock signal from one of the clock phase adjusting circuits to generate the operation clock signal.

17. The memory system of claim 16, wherein the de-glitch circuit is enabled by the phase-adjusted enable signal at any one of a waveform of the phase-adjusted clock signal having an even number count.

18. The memory system of claim 10, wherein the memory device is a DDR memory device or an SDR memory device.

\* \* \* \* \*